United States Patent [19]
Ngo

[11] Patent Number: 6,150,876
[45] Date of Patent: Nov. 21, 2000

[54] VOLTAGE BIAS, CURRENT SENSE PREAMPLIFIER FOR A MAGNETORESISTIVE READER

[75] Inventor: Tuan V. Ngo, Eden Prairie, Minn.

[73] Assignee: Lucent Technologies Inc., Murray Hill, N.J.

[21] Appl. No.: 09/285,475

[22] Filed: Apr. 2, 1999

Related U.S. Application Data

[60] Provisional application No. 60/080,869, Apr. 6, 1998.

[51] Int. Cl.[7] .................................................. G06G 7/12
[52] U.S. Cl. ........................ 327/563; 327/65; 327/538; 327/307; 360/68; 330/259
[58] Field of Search ...................................... 327/560, 563, 327/545, 538, 307, 65, 50, 52, 54; 330/259, 261; 360/46, 66, 67, 68

[56] References Cited

U.S. PATENT DOCUMENTS

| | | | |
|---|---|---|---|
| 5,434,717 | 7/1995 | Yoshinaga et al. ......................... | 360/68 |
| 5,534,818 | 7/1996 | Peterson ................................... | 327/538 |
| 5,914,630 | 6/1999 | Peterson ................................... | 327/513 |

*Primary Examiner*—Dinh T. Le
*Attorney, Agent, or Firm*—Kinney & Lange, P.A.

[57] ABSTRACT

A preamplifier system for receiving information from at least one magnetoresistive head cell and for supplying a signal to circuitry external to the preamplifier system is disclosed. The preamplifier system includes a bias current generator, a first preamplifier gain stage, and a second preamplifier gain stage. The bias current generator is connected between a first potential and the magnetoresistive head cell for providing a bias current to the magnetoresistive head cell. The first and second preamplifier gain stages include multiple transistors, resistors, capacitors, and current sources. The combination of first and second preamplifier gain stages provide the proper amplification of a signal received from the head cell while eliminating an unwanted DC offset signal.

18 Claims, 5 Drawing Sheets

VOLTAGE BIAS, CURRENT SENSE PREAMPLIFIER FOR A MAGNETORESISTIVE READER

CROSS-REFERENCE TO RELATED APPLICATION(S)

The present application is based upon and claims priority from U.S. Provisional Application No. 60/080,869 entitled "Voltage Bias, Current Sense Preamplifier For Dual Strip MR Head", filed on Apr. 6, 1998.

This application also cross-references U.S. Patent Applications entitled "Voltage Bias, Current Sense Preamplifier Using No AC-Coupling Capacitors for a Dual Strip Magnetoresistive Reader" and "Current Bias, Current Sense Preamplifier For A Magnetoresistive Reader", both applications filed on even date herewith and assigned to the assignee of the present application.

BACKGROUND OF THE INVENTION

The present invention is a read system for reading information from a storage medium and for providing an output signal to circuitry external from the read system. More particularly, the present invention is a voltage bias, current sense preamplifier for use with a magnetoresistive reader.

There are presently two types of disc drive systems which write information to and read information from a magnetic storage medium, such as a disc. First, there is an inductive write, inductive read system. Second, there is an inductive write, magnetoresistive (MR) read system. It is the second category in which the present invention lies.

The front end of a disc drive system typically consists of one or more read/write transducers (recording heads), an electronics module (containing the read preamplifier and the write driver), and interconnections between the various heads and the module. The module is placed close to the head to keep the interconnections as short as possible.

The present trend in the data storage industry is to increase aerial density on a magnetic storage medium at constant or even decreasing latencies. This results in magnetic storage mediums having narrower tracks, larger linear densities and higher data rates. While a single-element inductive read/write head has the attraction of simplicity, its applications are becoming outdated due to a non-adequate bandwidth. The bandwidth of a head directly affects the speed with which a head can read information from a magnetic storage medium. The larger the upper pole of the bandwidth, i.e., the point at which the gain of the head begins to roll off, the faster the head can read information from the magnetic storage medium.

In traditional inductive read/write heads, there is a severe conflict in choosing the ideal number of coil "turns" for read and write operations. Narrower track widths require a larger number of turns for reading. This makes the coil inductance increase quadratically. The resonance frequency of the coil inductance and the coil/wiring/electronics capacitance therefore decreases linearly. This reduces the useful data bandwidth rather than increasing it to accommodate a higher data rate. The use of a MR read element does not present this bandwidth restriction. It also allows separate optimization of the MR read element and the inductive write element, making possible write-wide, read-narrow strategies.

A preamplifier that senses a signal out from a MR read element is fundamentally different than a preamplifier which senses a signal from an inductive read sensor. The inductive read sensor has no DC bias across it so that a preamplifier can be directly coupled to it to sense the signal from DC frequencies up to the required upper bandwidth. An MR preamplifier, however, must have the ability to compensate for an inherent DC offset across the sensor which is required to properly bias the MR read element, thereby producing a linear output signal. This bias is on the order of a few hundred milli-volts so that a high gain amplifier that amplifies DC signals cannot be directly connected to the sensor. If such a connection were made, the preamplifier would sense this offset and saturate the amplifier. Therefore, a preamplifier which is connected to an MR read element should pass an AC signal representing information from the magnetic storage medium, but not past the DC biasing signal used to bias the MR read element.

In conjunction with a single strip MR read element, the MR read element, a preamplifier, and a bias current generator are formed in a series arrangement between two supply terminals. Thus, the current supplied by the bias current generator is fed to the MR element so as to bias the MR element. The current supplied to the bias current generator is also fed to the preamplifier circuit. This bias current through the preamplifier circuit results in a certain noise contribution. Prior art preamplifier circuits utilize a capacitor connected between a low voltage potential terminal and a gate of a MOSFET or jFET transistor within the individual channel circuit. Thus, the unwanted DC signal is eliminated during a read operation. However, the MOSFET or jFET transistor of the preamplifier circuit provides a substantially high level of unwanted noise into the system and prevents accurate reading of the desired signal.

In conjunction with a dual strip magnetoresistive head, which includes two separate magnetoresistive elements, prior art preamplifier circuits utilize a cross-coupling design which cross-couples two capacitors between two separate MOSFET or jFET transistors within the individual channel circuit. Each MOSFET or jFET transistor corresponds to one of the MR elements similar to the single strip MR design. Once again, the two MOSFET or jFET transistors provide a substantially high level of unwanted noise to the system which prevents accurate reading of the desired signal. In addition, multiple capacitors per individual channels were necessary.

Therefore, there is a need for a preamplifier circuit which will block any unwanted DC signals during a read operation and will minimize the amount of unwanted noise within the preamplifier circuitry using a minimal amount of components.

BRIEF SUMMARY OF THE INVENTION

The present invention is a preamplifier system for receiving information from at least one magnetoresistive head cell and for supplying a signal to circuitry external to the preamplifier system. The preamplifier system include a bias current generator, a first preamplifier stage, and a second preamplifier stage. The bias current generator is connected between a first potential and the magnetoresistive head cell and provides a bias current to the magnetoresistive head cell. The combination of a first and a second preamplifier gain stage provides proper amplification of a signal received from the head cell, while eliminating an unwanted DC offset signal. This DC offset signal is initially necessary to properly bias the magnetoresistive resistors so that they can properly read information from a storage medium. However, this DC offset signal is unwanted in the preamplifier stage.

The present design provides relatively low value DC coupling capacitors which in turn provides a fast transition time. In addition, the present invention provides a low noise system having a high supply rejection and a high common mode rejection.

DETAILED DESCRIPTION

The present invention is a current bias, current sense preamplifier for use with one or more magnetoresistive (MR) read heads. The present invention provides a preamplifier which minimizes a DC signal during a read operation and minimizes the amount of unwanted noise within the preamplifier circuitry caused by MOSFET or jFET transistors in prior art designs. The DC signal is initially necessary to properly bias the MR reader such that it will read information from the magnetic storage medium. The present invention can be used in conjunction with a single or a dual strip MR head, and can be used with a single head or a plurality of heads.

Figure 1A:
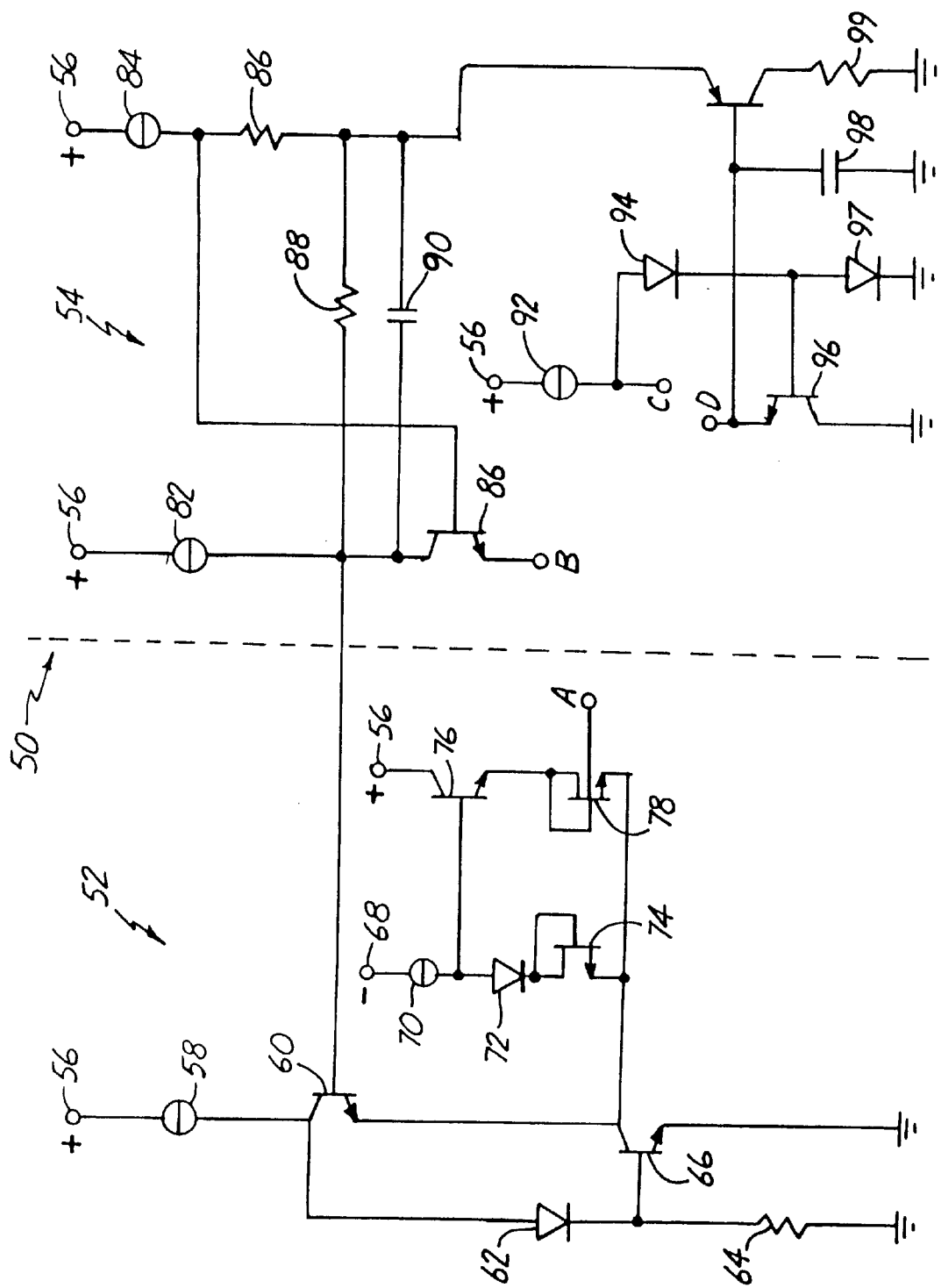
FIG. 1A is a prior art circuit diagram showing a prior art preamplifier circuit.
Figure 1B:
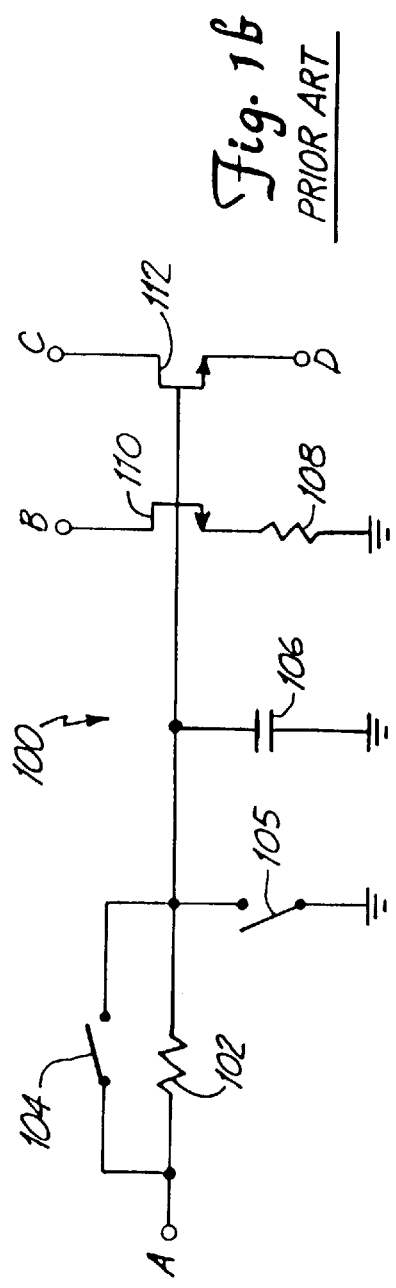
FIG. 1B is a prior art circuit diagram showing an individual channel circuit with use for a single strip magnetoresistive element.

FIGS. 1A and 1B are circuit diagrams showing a prior art preamplifier circuit and a prior art individual channel circuit for use with a single strip MR head, respectively. FIGS. 1A and 1B can be coupled together in order to realize the multiplexed read out of information from a storage system. FIG. 1A shows prior art circuitry 50 which is common to all MR heads and FIG. 1B shows prior art circuitry 100 which is for an individual channel. While circuitry 100 is for an individual channel, multiple channels can be utilized by copying circuitry 100 as necessary.

Prior art circuitry 50 is divided into two portions, feedback circuit 52 and preamplifier circuit 54. Feedback circuit 52 includes consist potential 56, current source 58, bi-polar junction transistor 60, diode 62, resistor 64, bi-polar junction transistor 66, consist potential 68, current source 70, diode 72, MOS transistor 74, bi-polar junction transistor 76, and MOS transistor 78.

Preamplifier circuit 54 includes consist potential 56, current source 80, current source 82, bi-polar junction transistor 84, resistors 86 and 88, capacitor 90, current source 92, diode 94, bi-polar junction transistor 96, diode 97, capacitor 98, and resistor 99. Also shown in FIG. 1A are terminals A, B, C, and D. These terminals are the interconnection points between prior art circuitry 50 of FIG. 1A and prior art circuitry 100 of FIG. 1B.

Prior art FIG. 1B shows prior art circuitry 100 which includes terminals A, B, C, and D, MR resistor 102, switches 104 and 105, DC blocking capacitor 106, resistor 108, and MOS transistors 110 and 112.

While the prior art design shown in FIGS. 1A and 1B provided proper feedback and preamplifier circuitry, the use of MOS transistors 110 and 112 within individual channel circuitry 100 provide an unacceptable amount of noise which interferes with the reading of information from the magnetic storage medium by MR resistor 102 during a read operation.

Figure 1C:
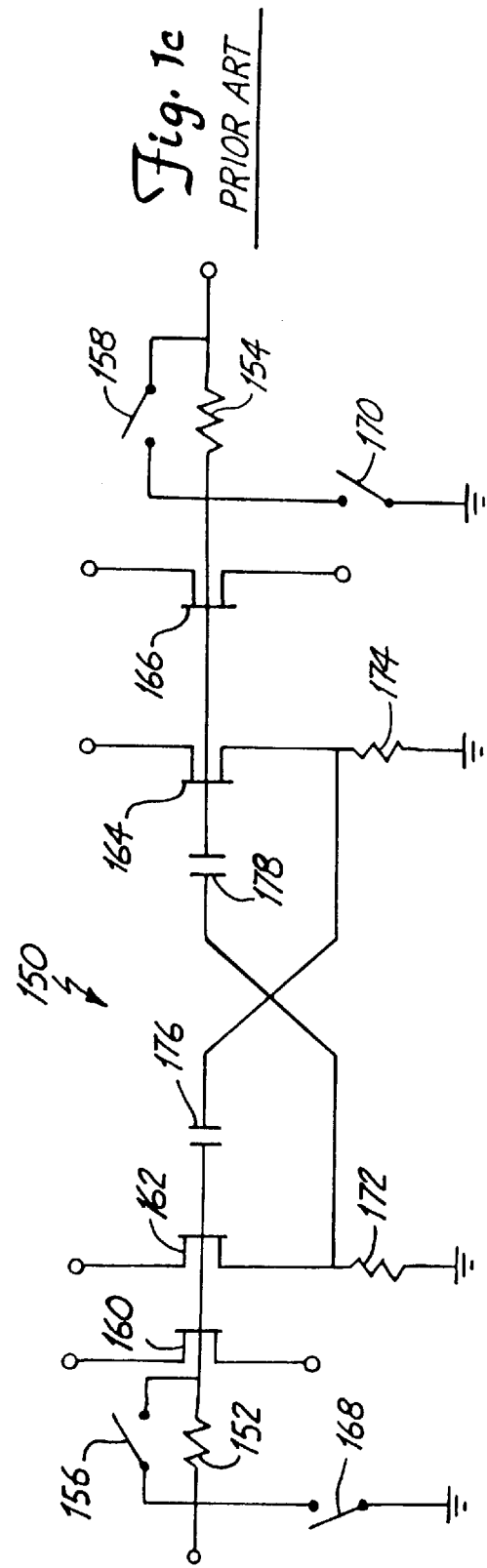
FIG. 1C is a prior art circuit diagram showing an individual channel circuit for use with a dual strip magnetoresistive element.

FIG. 1C is a prior art circuit diagram showing individual channel circuitry 150 for a balanced or dual version MR head. Circuitry 150 includes MR resistors 152 and 154, switches 156 and 158, MOS transistors 160, 162, 164, and 166, switches 168 and 170, resistors 172 and 174, and DC blocking capacitors 176 and 178.

Circuitry 150 shown in FIG. 1C is virtually identical to circuitry 100 of FIG. 1B, except that circuitry 150 of FIG. 1C includes a second MR resistor and related circuitry. Therefore, the right side of FIG. 1C is the mirror image of the left side of FIG. 1C. One distinction between circuitry 150 of FIG. 1C and circuitry 100 of FIG. 1B is that rather than having DC blocking capacitor 106 of FIG. 1B connected to ground, DC blocking capacitors 176 and 178 of FIG. 1C are crossed coupled between the drain and source of MOS transistors 162 and 164. Similar to circuitry 100 shown in FIG. 1B, circuitry 150 of FIG. 1C suffers from unacceptably high noise due to MOS transistors 160, 162, 164, 166, thereby preventing MR resistors 152 and 154 from properly reading information from a magnetic storage medium during a read operation.

Figure 2:
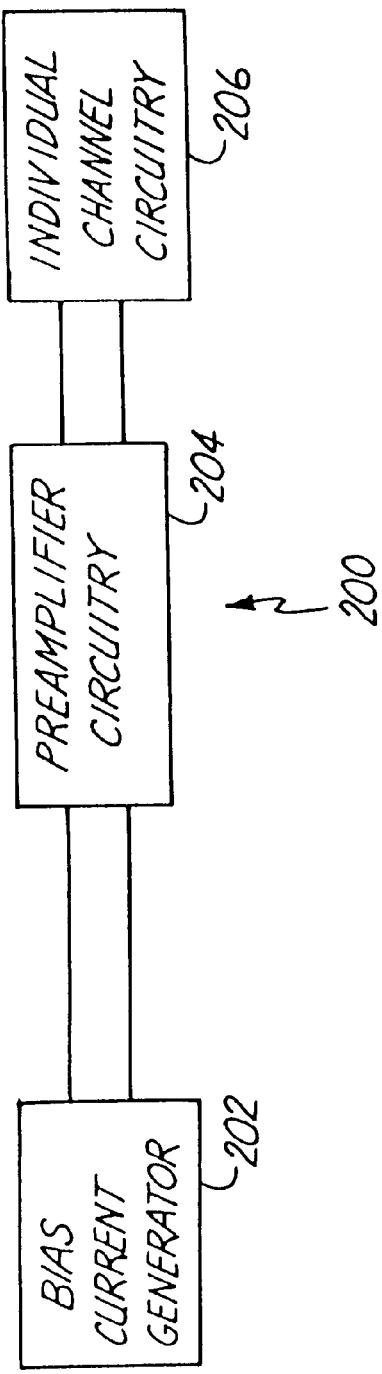
FIG. 2 is a block diagram of a read system of the present invention.

FIG. 2 is a block diagram of a read system of the present invention. As shown in FIG. 2, block diagram 200 includes bias current generator 202, preamplifier circuitry 204, and individual channel circuitry 206. The present invention lies within preamplifier 204 and individual channel circuitry 206 and utilizes at least one operational amplifier in a novel arrangement with at least one capacitor. This novel arrangement permits proper biasing of an MR head within individual channel circuitry 206 through use of a DC signal, while minimizing both the DC signal and unwanted noise during a read operation.

Figure 3:
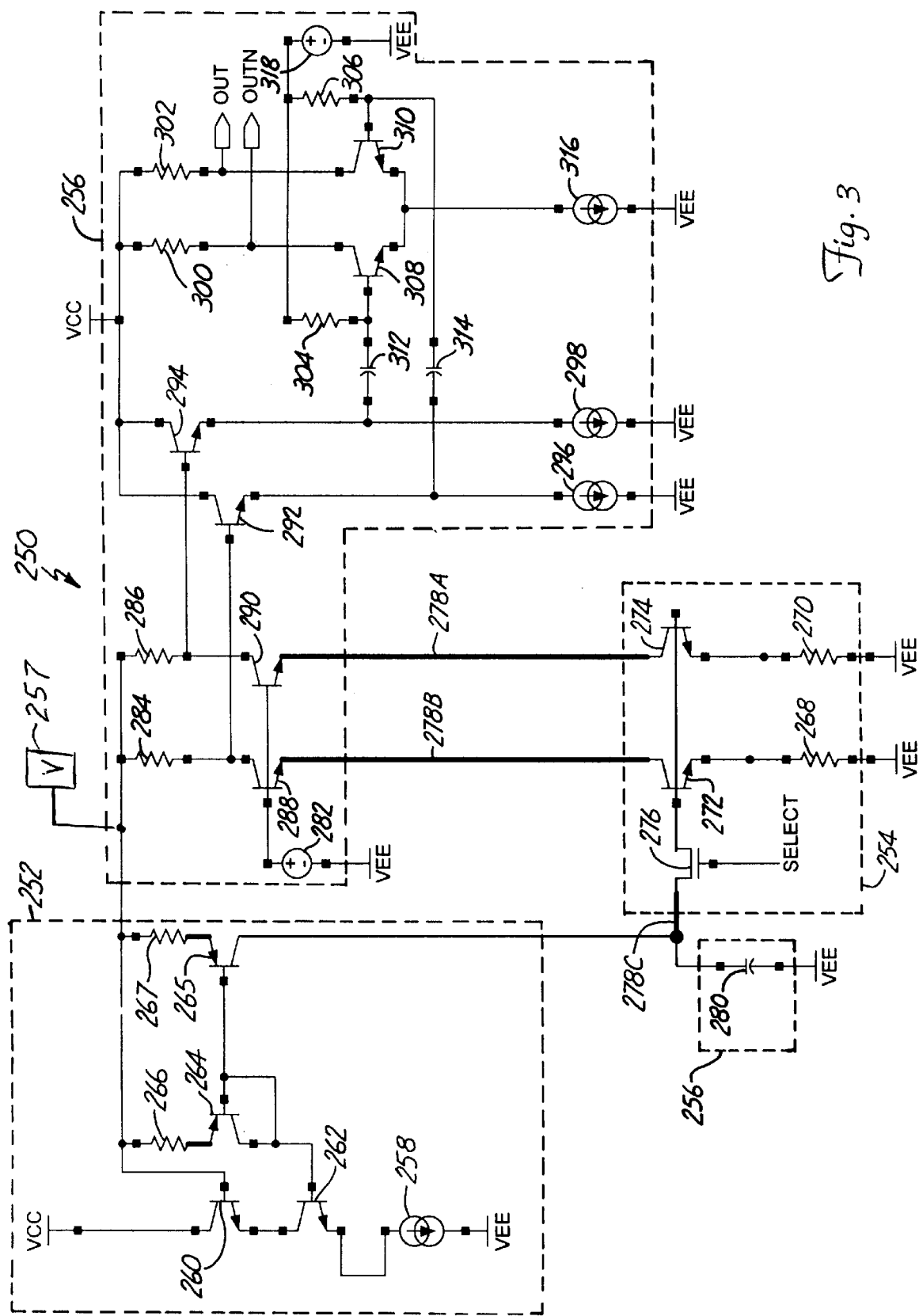
FIG. 3 is a circuit diagram showing the present invention for use with a dual strip magnetoresistive element.

FIG. 3 is a circuit diagram showing the present invention for use with a dual strip MR element. Read system 250 includes bias current generator 252, head cell circuitry 254, preamplifier circuitry 256, and voltage regulator 257.

Bias current generator 252 is a bias current generator system which will properly bias the head cell circuitry. However, it is understood that other designs for bias current generator 252 may be utilized in conjunction with the present invention. Voltage regulator 257 regulates the voltage within bias current generator 252 and preamplifier 256.

Bias current generator 252 includes first potential $V_{CC}$, second potential $V_{EE}$, current source 258, transistors 260, 262, 264, and 265 and resistors 266 and 267. Transistors 260 and 262 are NPN bipolar junction transistors (BJTs), while transistors 264 and 265 are PNP BJTs. The collector of transistor 260 is connected to first voltage potential $V_{CC}$, and the base of transistor 260 is connected to preamplifier circuitry 256. The emitter of transistor 260 is connected to the collector of transistor 262, while the emitter of transistor 262 is connected to current source 258, which is in turn connected to second voltage potential $V_{EE}$. Resistor 266 is connected between preamplifier circuitry 256 and the emitter of transistor 264. The collector of transistor 264 is connected to the base of transistor 264 and connected to the base of transistor 262. The base of transistor 264 is also connected to the base of transistor 265. Resistor 267 is connected between the emitter of transistor 265 and preamplifier circuitry 256. The collector of transistor 265 is connected to head cell circuitry 254 and to capacitor 280 of preamplifier circuitry 256.

In one preferred embodiment, in order to properly design the circuit of the present invention, resistor 266 has a value in the range of 10 to 30 kilo Ohms, while resistor 267 has a value in the range of 5 to 20 kilo Ohms. Current source 258 should have a value in the range of 2 to 10 milliAmperes.

Head cell circuitry 254 further includes MR resistors 268 and 270, PNP BJTs 272 and 274, and switch 276. MR resistors 268 and 270 are connected between the emitters of BJTs 272 and 274, respectively, and second voltage potential $V_{EE}$. The bases of transistors 272 and 274 are interconnected and are also connected to switch 276. The collectors of BJTs 272 and 274 are connected via bus lines 278A and 278B to preamplifier circuitry 256. Switch 276 is connected to bias current generator 252 and preamplifier circuitry 256 via bus line 278C.

In one preferred embodiment, switch 276 is a transistor, such as a Nmos device, which when properly biased is activated. Having a low resistance at switch 276 is not critical since any noise at this node is common mode noise. While FIG. 3 shows a single head cell circuitry, several head cells circuits can be connected to bias current generator 252 and preamplifier circuitry 256 via bus lines 278A, B, and C. Thus, bias current generator 252 and preamplifier circuitry 256 can be connected to numerous head cell circuits. Switch 276 dictates whether head cell circuitry 254 is receiving a power supply from the read system and transmitting a read signal to preamplifier circuitry 256.

In one preferred embodiment, in order to properly design the circuitry of the present invention, MR resistors 268 and 270 should each have a value in the range of 5 to 100 Ohms.

Preamplifier circuitry 256 utilizes two separate gain stages in order to provide a proper signal to external circuitries. The first stage includes capacitor 280, voltage source 282, resistors 284 and 286, BJTs 288, 290, 292, and 294, and current source generators 296 and 298. The second gain stage of preamplifier circuitry 256 includes resistors 300, 302, 304, and 306, BJTs 308 and 310, capacitors 312 and 314, current source 316, and voltage source 318.

As shown in FIG. 3, transistors 288, 290, 292, 294, 308, and 310 are all NPN BJTs. Voltage source 282 is connected between voltage potential $V_{EE}$ and the base of transistor 288. The base of transistor 288 is also connected to the base of transistor 290. Resistors 284 and 286 are connected between bias current generator 252 and the collector of transistors 288 and 290, respectively. The emitters of transistors 288 and 290 are connected to head cell circuitry 254 via bus lines 278B and 278A, respectively.

The base of transistor 292 is connected between resistor 284 and the collector of transistor 288, while the base of transistor 294 is connected between resistor 286 and the collector of transistor 290. The collectors of transistors 292 and 294 are connected to voltage potential $V_{CC}$, while the emitters of transistors 292 and 294 are connected to current sources 296 and 298, respectively. Capacitor 312 is a DC blocking capacitor which is connected between the emitter of transistor 294 and the base of transistor 308, while capacitor 314 is a DC blocking capacitor which is connected between the emitter of transistor 292 and the base of transistor 310. The emitters of transistors 308 and 310 are interconnected and are also connected to current source 316. Resistors 300 and 302 are connected between voltage potential $V_{CC}$ and the collector of transistors 308 and 310, respectively. Resistors 304 and 306 are connected between the bases of transistors 308 and 310 and voltage source 318, respectively. Current source 316 is connected to potential $V_{EE}$.

Within the first gain stage of preamplifier circuitry 256, transistors 288 and 290 are cascode devices. The emitters of transistors 288 and 290 are the input points for all other individual head channels. Resistors 284 and 286 are the gain load resistors. The first stage gain is determined by dividing the value of resistor 284 by the value of resistor 268 or by dividing the value of resistor 286 by the value of resistor 270.

Common capacitor 280 of preamplifier circuitry 256 determines the low corner band with frequency, as well as the low corner noise frequency, of preamplifier circuitry 256. Transistors 292 and 294 and current sources 296 and 298 are level shifters and output buffers which conclude the first stage gain.

The offset voltage of the first stage gain is eliminated by using two small capacitors 312 and 314 to AC-couple to the inputs of the second gain stage. The second gain stage consists of differential transistor pairs 308 and 310, load resistors 300 and 302, and tail current 316.

In one preferred embodiment, in order to properly design the circuitry of the present invention, capacitor 280, which is within preamplifier circuitry 256, has a value in the range of 25 to 500 picoFarrads, while capacitors 312 and 314 each have a value in the range of 10 to 250 picoFarrads. Resistors 284 and 286 should each have a value in the range of 100 to 750 Ohms, while current sources 296 and 298 should each have a value in the range of 0.25 to 3.0 milliAmperes. Voltage sources 282 and 318 should each have a value in the range of 0.5 to 5.0 volts. Resistors 300 and 302 should each have a value in the range of 250 to 3000 Ohms, while resistors 304 and 306 should each have a value in the range of 5.0 to 20.0 kilo Ohms. Current source 316 should have a value in the range of 1.0 to 5.0 milliAmperes.

Figure 4:
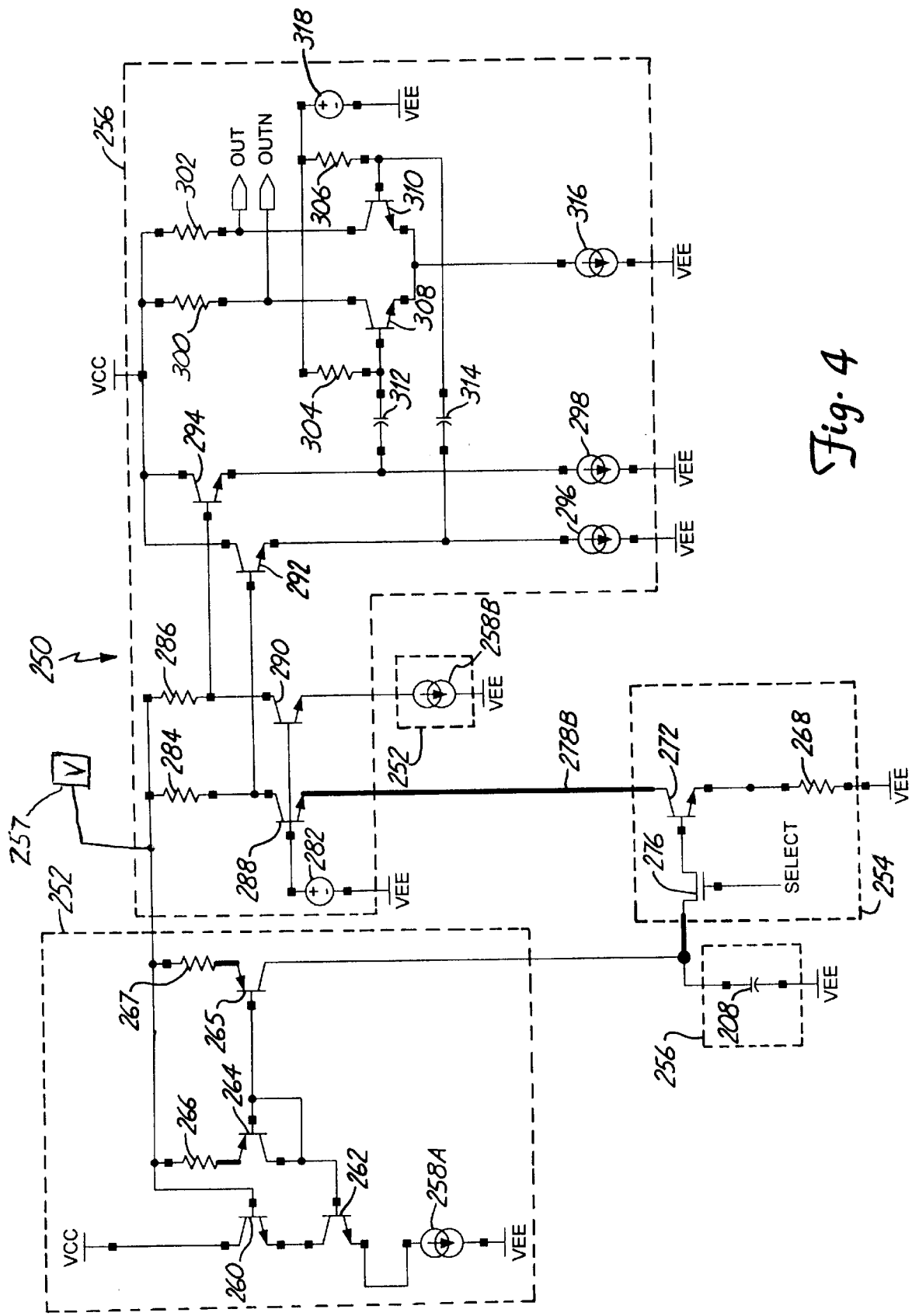
FIG. 4 is a circuit diagram showing the present invention for use with a single strip magnetoresistive element.

FIG. 4 is virtually identical to FIG. 3 except that a single MR resistor configuration is utilized rather than a dual MR resistor configuration. The circuitry of FIG. 4 is identical to the circuitry of FIG. 3, except that the emitter of transistor 290 is now connected to voltage potential $V_{EE}$ via current source 258B. Current source 258B is identical to current source 258A.

The two stage design of the present invention provides proper amplification of a read signal received from head cell circuitry 254, while eliminating an unwanted DC signal. The DC signal is initially necessary to properly bias MR resistors 268 and 270. With the present design, the voltage-bias, current-sense preamplifier provides a simple design having small DC coupling capacitors 280, 312, and 314 which in turn provide fast transition time. In addition, the present design provides low noise, a high supply rejection, and a high common mode rejection.

Although the present invention has been described with reference to preferred embodiments, workers skilled in the art will recognize that changes may be made in form and detail without departing from the spirit and scope of the invention.

What is claimed is:

1. A preamplifier system for receiving information from a magnetoresistive head cell having a first and a second transistor, a first and a second magnetoresistive resistor, and a switch, and for supplying a signal to circuitry external to the preamplifier system, the system comprising:

a bias current generator connected between a first potential and the magnetoresistive head cell for providing a bias current to the magnetoresistive head cell;

a first preamplifier gain stage further comprising:

a third transistor having an emitter connected to a collector of the first transistor;

a fourth transistor connected in cascode with the third transistor and having an emitter connected to a collector of the second transistor and a base connected to a base of the third transistor;

a first resistor connected between the bias current generator and the collector of the third transistor;

a second resistor connected between the bias current generator and the collector of the fourth transistor;

a first capacitor connected between the switch and a second potential;

a fifth transistor having a base, a collector, and an emitter, the collector connected to the first potential and the base connected to the collector of the third transistor;

a sixth transistor having a base, a collector, and an emitter, the collector connected to the first potential and the base connected to the collector of the fourth transistor;

a first current source connected between the second potential and the emitter of the fifth transistor; and a second current source connected between the second potential and the emitter of the sixth transistor;

a second preamplifier gain stage further comprising:

a seventh transistor having a base, a collector, and an emitter;

an eighth transistor having a base, a collector, and an emitter;

a third resistor connected between the first potential and the collector of the seventh transistor;

a fourth resistor connected between the first potential and the collector of the eighth transistor;

a third current source connected between the emitters of the seventh and eighth transistors and the second potential;

a first voltage source connected between the second potential and a first node;

a fifth resistor connected between the base of the seventh transistor and the first node;

a sixth resistor connected between a base of the eighth transistor and the first node;

a second capacitor connected between the emitter of a fifth transistor, the first current source, and the base of the eighth transistor; and a third capacitor connected between the emitter of the sixth transistor, the second current source, and the base of the seventh transistor.

2. The preamplifier system of claim 1, wherein the first and second resistors each have a value in the range of 100 to 750 Ohms.

3. The preamplifier system of claim 1, wherein the first capacitor has a value in the range of 25 to 500 picoFarrads.

4. The preamplifier system of claim 1, wherein the first and second current sources each have a value in the range of 0.25 to 3.0 milliAmperes.

5. The preamplifier system of claim 1, wherein the third and fourth resistors each have a value in the range of 250 to 3000 Ohms.

6. The preamplifier system of claim 1, wherein the third current source has value in the range of 1.0 to 5.0 milliAmperes.

7. The preamplifier system of claim 1, wherein the first voltage potential has a value in the range of 0.5 to 5.0 volts.

8. The preamplifier system of claim 1, wherein the fifth and sixth resistors each have a value in the range 5.0 to 20.0 kilo Ohms.

9. The preamplifier system of claim 1, wherein the second and third capacitors each have a value in the range of 10 to 250 picoFarrads.

10. A preamplifier system for receiving information from a magnetoresistive head cell having a first transistor, a magnetoresistive resistor, and a switch, and for supplying a signal to circuitry external to the preamplifier system, the system comprising:

a bias current generator connected between a first potential and the magnetoresistive head cell for providing a bias current to the magnetoresistive head cell;

a first preamplifier gain stage further comprising:

a second transistor having an emitter connected to a collector of the first transistor;

a third transistor connected in cascode with the second transistor and having an emitter connected to bias current generator and a base connected to a base of the second transistor;

a first resistor connected between the bias current generator and the collector of the second transistor;

a second resistor connected between the bias current generator and the collector of the third transistor;

a first capacitor connected between the switch and a second potential;

a fourth transistor having a base, a collector, and an emitter, the collector connected to the first potential and the base connected to the collector of the second transistor;

a fifth transistor having a base, a collector, and an emitter, the collector connected to the first potential and the base connected to the collector of the third transistor;

a first current source connected between the second potential and the emitter of the fourth transistor; and a second current source connected between the second potential and the emitter of the fifth transistor;

a second preamplifier gain stage further comprising:

a sixth transistor having a base, a collector, and an emitter;

a seventh transistor having a base, a collector, and an emitter;

a third resistor connected between the first potential and the collector of the sixth transistor;

a fourth resistor connected between the first potential and the collector of the seventh transistor;

a third current source connected between the emitters of the sixth and seventh transistors and the second potential;

a first voltage source connected between the second potential and a first node;

a fifth resistor connected between the base of the sixth transistor and the first node;

a sixth resistor connected between a base of the seventh transistor and the first node;

a second capacitor connected between the emitter of a fourth transistor, the first current source, and the base of the seventh transistor; and a third capacitor connected between the emitter of the fifth transistor, the second current source, and the base of the sixth transistor.

11. The preamplifier system of claim 10, wherein the first and second resistors each have a value in the range of 100 to 750 Ohms.

12. The preamplifier system of claim 10, wherein the first capacitor has a value in the range of 25 to 500 picoFarrads.

13. The preamplifier system of claim 10, wherein the first and second current sources each have a value in the range of 0.25 to 3.0 milliAmperes.

14. The preamplifier system of claim 10, wherein the third and fourth resistors each have a value in the range of 250 to 3000 Ohms.

15. The preamplifier system of claim 10, wherein the third current source has value in the range of 1.0 to 5.0 milliAmperes.

16. The preamplifier system of claim 10, wherein the first voltage potential has a value in the range of 0.5 to 5.0 volts.

17. The preamplifier system of claim 10, wherein the fifth and sixth resistors each have a value in the range 5.0 to 20.0 kilo Ohms.

18. The preamplifier system of claim 10, wherein the second and third capacitors each have a value in the range of 10 to 250 picoFarrads.

* * * * *